(12) United States Patent
Park et al.

(10) Patent No.: US 7,502,262 B2
(45) Date of Patent: Mar. 10, 2009

(54) NAND TYPE FLASH MEMORY ARRAY AND METHOD FOR OPERATING THE SAME

(75) Inventors: Byung-Gook Park, Seoul (KR); Tae-Hoon Kim, Seoul (KR); Il-Han Park, Gyeonggi-do (KR)

(73) Assignees: Seoul National University Industry Foundation, Seoul (KR); Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 11/423,691

(22) Filed: Jun. 12, 2006

(65) Prior Publication Data

US 2006/0279991 A1   Dec. 14, 2006

(30) Foreign Application Priority Data

Jun. 11, 2005   (KR) .................... 10-2005-0050108

(51) Int. Cl.
G11C 16/04   (2006.01)
G11C 16/12   (2006.01)

(52) U.S. Cl. .................... 365/185.17; 365/185.18; 365/176; 365/185.27; 257/314; 257/315; 257/347

(58) Field of Classification Search ............ 365/185.18, 365/185.17, 176, 185.28, 185.29, 185.27; 257/315, 314, 347
See application file for complete search history.

(56) References Cited

U.S. PATENT DOCUMENTS

| 5,587,604 | A | | 12/1996 | Machesney et al. | |
|---|---|---|---|---|---|
| 5,796,142 | A | * | 8/1998 | Lin et al. ................. | 257/316 |
| 5,814,854 | A | * | 9/1998 | Liu et al. ................. | 257/315 |
| 5,889,306 | A | * | 3/1999 | Christensen et al. ........ | 257/350 |
| 6,249,027 | B1 | | 6/2001 | Burr | |
| 2002/0109187 | A1 | * | 8/2002 | Matsumoto et al. ......... | 257/347 |
| 2002/0179962 | A1 | * | 12/2002 | Kato et al. ................ | 257/316 |
| 2003/0123307 | A1 | * | 7/2003 | Lee et al. ................. | 365/200 |
| 2004/0145024 | A1 | * | 7/2004 | Chen et al. ............... | 257/390 |
| 2005/0057966 | A1 | * | 3/2005 | Nazarian ............... | 365/185.01 |

FOREIGN PATENT DOCUMENTS

| JP | 2005-071558 | 3/2005 |
|---|---|---|
| KR | 1020020062431 | 7/2002 |
| KR | 1020040084400 | 10/2004 |
| KR | 1020040086702 | 10/2004 |
| WO | WO 01/43186 | 6/2001 |

* cited by examiner

*Primary Examiner*—J. H. Hur
(74) *Attorney, Agent, or Firm*—Marger Johnson & McCollom PC

(57) ABSTRACT

A NAND type flash memory array which is composed of a plurality of memory cells with a shallow junction on an SOI substrate to make the body region depleted fully when each channel of the memory cells is turned on is provided. The invention improves the efficiency of a reading operation, enables an erasing operation on the SOI structure and enables use of a low voltage $V_{PASS}$ instead of a high voltage $V_{PASS}$, which is used for a programming operation in a conventional NAND type flash memory array, and therefore it diminishes programming disturbance more effectively than a conventional array.

5 Claims, 5 Drawing Sheets

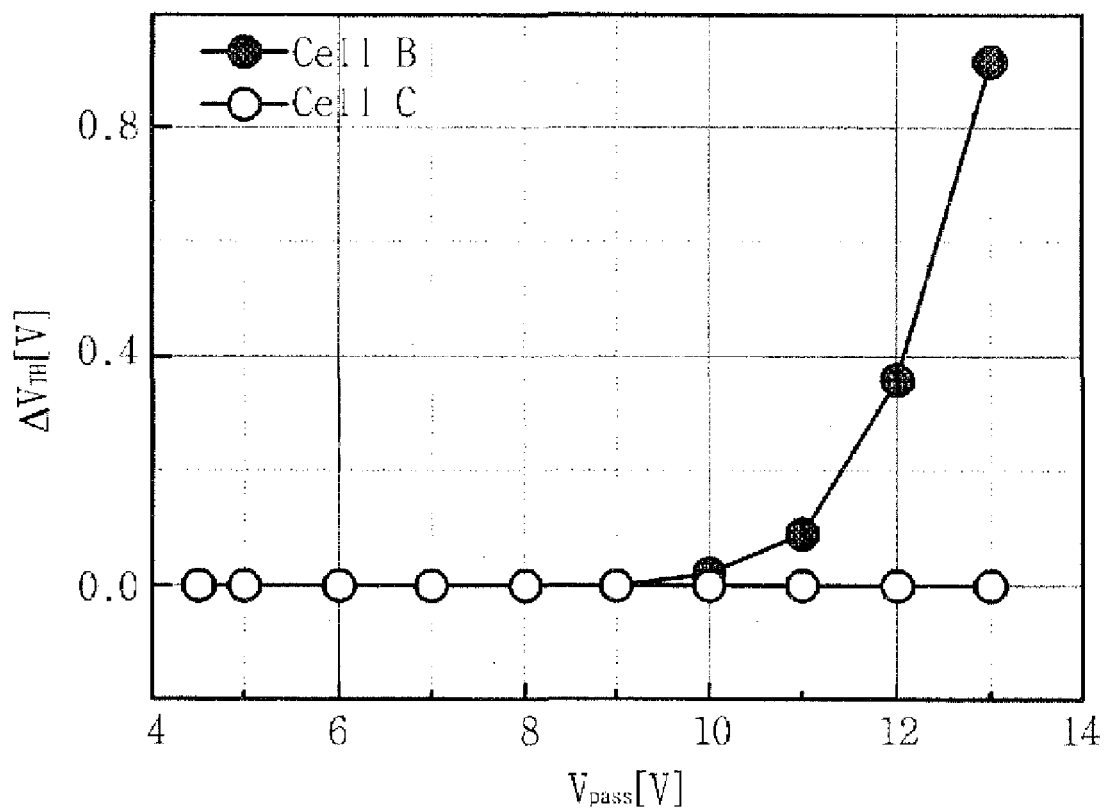

NAND TYPE FLASH MEMORY ARRAY AND METHOD FOR OPERATING THE SAME

CROSS-REFERENCE TO RELATED APPLICATION

This application claims priority under 35 U.S.C. § 119 of Korean Patent Application 2005-0050108 filed on Jun. 11, 2005, the entire contents of which are hereby incorporated by reference.

BACKGROUND

1. Technical Field

The present invention relates to a NAND type flash memory array and a method for operating the same, and more particularly to a NAND type flash memory array with a cell structure which is doped with shallow junction on fully depleted silicon on insulator (FDSOI) and a method for operating the same.

2. Description of Related Art

As the mobile and multi-media industry has been developed recently, a demand for flash memory has been increasing.

Now, an application of flash memory enables one to store and update at any time system BIOS such as networking apparatuses (router, hub and so on), mobile phones and PDAs (personal digital assistants) and flash memory is a highly marketable product as a recording device suitable for large amounts of information, specifically, solid state memory, such as memory card, digital camera, voice/image storage device and portable computer. As multi-media applications have been increasing rapidly, a demand for storage medium with various uses has been increasing suddenly and the application field of flash memory devices continues to grow.

A common flash memory is classified as NOR or NAND type, according to its array organization of unit cells. In a NOR type flash memory, the speed of programming is rapid due to a CHE injection program mechanism, and the random access characteristic is excellent due to the cell array structure. However, it has a relative weak point for integration. On the contrary, in a NAND type flash memory, the speed of programming is slow due to an F-N tunneling mechanism, and the random access characteristic is not good. But the integration capability of the NAND type memory is excellent. So, a NAND type flash memory is economically superior to a NOR type flash memory array. Therefore, a NOR type flash memory can be utilized in a field which requires rapid random access and a NAND type flash memory can be utilized in a recording device suitable for large amounts of information in which the random access time is not as important.

A reduction in memory cell size has been caused by the drive to improve the integration of flash memory. When trying to scale down memory cell size, to prevent short channel effect and other adverse results, research has been proceeding on the flash memory cell on fully depleted silicon on insulator substrates (FDSOI). However, a NAND type flash memory array with FDSOI has difficulty in applying an appropriate body bias to the fully depleted body region and it makes erasing a memory cell difficult.

On programming a conventional NAND type flash memory, to prevent slight program disturbance of the other cells near the objective cell to be programmed, high voltage $V_{PASS}$ has been applied not to word lines including the objective cell but to all the other word lines. However, there is still slight program disturbance, and it is a factor which limits the number of programs in a NAND type flash memory array.

A conventional NAND type flash memory array has a structure in which unit memory cells are arranged in series as shown in FIG. 1 and the number of unit memory cells is from 8 to 32. To operate the memory, voltages are applied to each line as shown in TABLE 1.

TABLE 1

|  | Erase | Program | Read |
| --- | --- | --- | --- |
| PGM W/L | 0 | 15~20 | 0 |
| Pass W/L | 0 | 10 | 4.5 |
| SSL | F | Vcc | 4.5 |
| GSL | F | 0 | 4.5 |
| CSL | F | 0 | 0 |
| SEL B/L | F | 0 | 1.2 |
| UNS B/L | F | Vcc | <0.8 |
| Bulk | 21 | 0 | 0 |

Especially, on programming cell A, high voltage of from 15 to 20V is applied to word line W/L1, to which the gate of cell A is connected electrically, and this makes the other cells (such as cell C), which are not to be programmed but hold the word line W/L1 in common, programmed due to the high voltage of the same word line. To prevent this in a conventional NAND array, a self-boosting method is adopted wherein a voltage of 0V (ground) is applied to the bit line B/L0, which an objective cell to be programmed is connected electrically to, and voltage $V_{CC}$ is applied to the other bit lines (such as B/L1), which the other cells not to be programmed are connected electrically to, as shown in TABLE 1. This makes the B/L0 selective transistor turned on, transmitted voltage 0V (ground) to the channel of the objective cell to be written, and accomplishes the program operation, and this makes the other selective transistors of unselected B/Ls (such as B/L1) turned off, thereby floating all the memory cells which are connected to the unselected B/Ls (such as B/L1). Then, the channel potential under the gate of the floated cells (such as C) is determined by the voltages applied to word lines and the capacitors between the control gate and the body. So, for example, the degree of programming of cell C is determined by the difference between the voltage applied to W/L1 and the determined channel potential.

To decrease the degree of programming of cell C, its channel potential should be increased. And to increase the channel potential, a high voltage should be applied to the other word lines, which are not connected electrically to the objective cell. This high voltage is the voltage $V_{PASS}$, and is around 10V in a conventional type NAND array as shown in TABLE 1. When the voltage $V_{PASS}$ is too low, the self-boosting is ineffective and cell C is interfered. When the voltage $V_{PASS}$ is too high, cell B is interfered. This interference does harm to the reliability of the memory cell, and it is a factor which limits the number of programs.

When trying to scale down a memory cell on a bulk substrate, to prevent degradation, researchers have studied methods to improve characteristics of the transistor of each cell by manufacturing memory cells on FDSOI.

However, in a conventional NAND type flash memory array with an SOI structure, it is impossible to erase a flash memory as in TABLE 1, because a bulk bias is not applied. If the erasing operation is attempted by applying a body voltage to a bulk under the insulator, the very high voltage, higher than the usual voltage, should be applied to it, due to a low efficiency of the body voltage transmitted to the channel by the small capacitance of the insulator.

When manufacturing a memory cell with a usual bulk structure, in which the silicon region on insulator is bulky, there is no problem in the erasing operation. However, characteristics of the reading and programming operation become just the same as an array which is manufactured with a bulk structure, and so there is no usefulness for the SOI substrate.

SUMMARY

Some embodiments of the invention are directed to a NAND type flash memory array with a new structure, in which memory cells are arranged with a shallow junction on a FDSOI substrate and a body bias contact region are formed over an active region on the FDSOI substrate, and a method for operating the same.

Another aspect of the present invention is to provide a NAND type flash memory array on an SOI substrate, improve characteristics of the reading operation of a memory cell and connect the conduction path, which is formed under a shallow junction of memory cells, to the body biasing contact region. This enables all memory cells with one contact terminal, which is formed on the body biasing contact region, to body bias and do the erasing operation.

A further aspect of the present invention is to provide a technology that reduces a program disturbance effectively by raising the efficiency of self-boosting on the programming operation with the lower voltage $V_{PASS}$ than a conventional voltage.

BRIEF DESCRIPTION OF THE FIGURES

The invention may be better understood by the drawings that are briefly described below and attached hereto, in the several figures of which identical reference numbers (if any) refer to identical or similar elements.

FIG. 7 is a graph illustrating the electrical characteristics which shows the degree of program disturbance on a programming operation in some embodiments of the invention.

DETAILED DESCRIPTION

To accomplish objectives of the present invention, a NAND type flash memory array includes one or more bit lines on an SOI substrate; a first selective gate line arranged vertically to the bit lines; a plurality of word lines arranged vertically to the bit lines; a second selective gate line arranged vertically to the bit lines; a common source line arranged vertically to the bit lines; and a plurality of memory cells connected in series with a first selective transistor and a second selective transistor along each bit line, wherein the NAND type flash memory array includes one body biasing contact region which is located right next to the second selective gate line and connected to one side of an active region just below the second selective gate line when viewed in plan view.

A detailed description of preferred embodiments of a NAND type flash memory array of the invention is provided with respect to the accompanying drawings. It must be comprehended that the following preferred embodiments are exemplary only to help understand the present invention and not to limit its interpretation.

In the description following, reference number 100 indicates a buried oxide layer, 220 means a common source line (CSL), 240 means a common source/drain region, 260 means a body region, 300 means a gate insulating layer, 400 means a second selective gate line, and 500 means a word line (W/L1).

Figure 2:
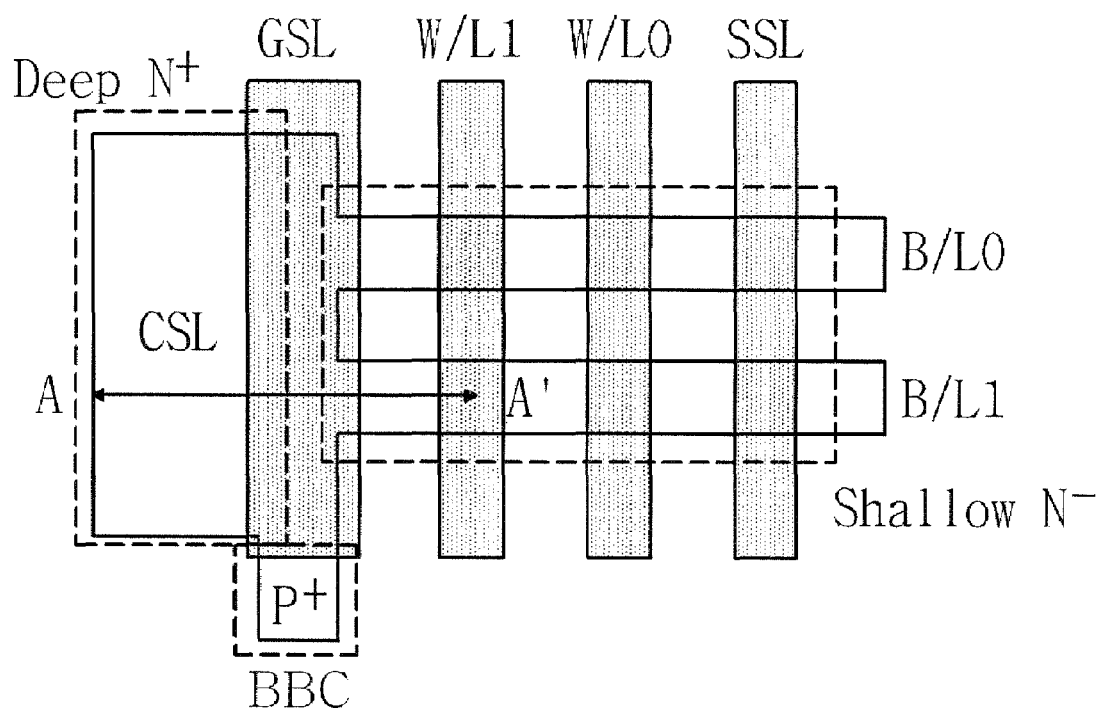
FIG. 2 is a layout of a NAND type flash memory array according to some embodiments of the [present] invention.
Figure 3:
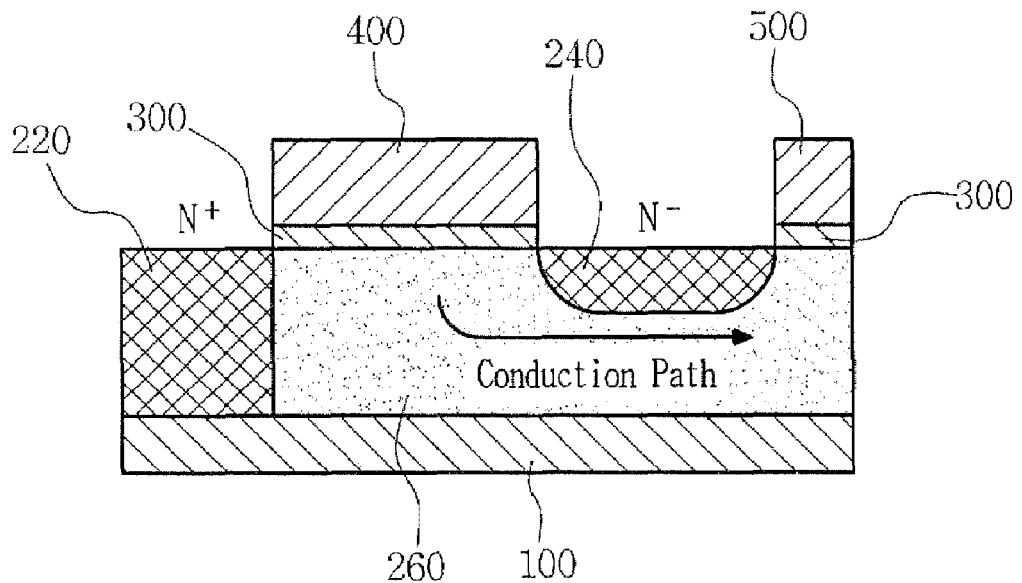
FIG. 3 is a cross sectional view taken along line A-A' in FIG. 2.

According to some embodiments of the invention, as shown in FIGS. 2 and 3, in a conventional NAND type flash memory array, one body biasing contact region (BBC) is included to connect to one side of an active region just below the second selective gate line (GSL). An SOI substrate can be P-type, N-type impurities can be injected into a common source line (CSL) with a deep junction and P-type impurities can be injected into the body biasing contact region (BBC) with a deep junction. Further, it is preferable that N-type impurities are injected into the source/drain region (common source/drain region: 240) of memory cells, which are connected to each bit line (B/L0, B/L1 and so on) in series, the depth of the junction being shallow so that a conduction path can be formed on the lower part of the common source/drain region 240 and within the body biasing contact region (BBC). In a NAND type flash memory array, an electrical contact is not formed on the junction region between memory cells, so that a structure with a shallow junction can be embodied. Also, it is preferable that the silicon layer of the SOI substrate is shallow enough to make the body region of the memory cells depleted fully (FDSOI) when the memory cells are turned on for the programming operation. The memory cell is preferably a charge trap memory device including a nitride layer, which has lots of deep level traps, such as SONOS (Silicon-Oxide-Nitride-Oxide-Silicon), MONOS (Metal-Oxide-Nitride-Oxide-Silicon), and MNOS (Metal-Nitride-Oxide-Silicon).

Accordingly, in a NAND type flash memory array of the invention, when each transistor of a memory cells turns on, the body region on each cell is depleted fully, a direct conduction path between a channel region of each memory cell and a body biasing contact region (BBC) is disconnected by this depleted layer, and the body biasing contact region (BBC) has an effect on the channel potential of each memory cell by the capacitor consisted of or inherent in the depleted layer. Because the capacitor is much smaller than a gate capacitor of each cell, a body bias caused by the body biasing contact region (BBC) has little effects on the changes of the potential of a channel region of each memory cell. However, when a transistor of each memory cell, which composes an array, turns off, the body region of each cell is not depleted. So, a body bias is transmitted to a channel region of each memory cell through the conduction path under a junction from the body biasing contact region (BBC).

A method for operating a NAND type flash memory array of the invention is comprised of programming the array by selecting a specific cell from a plurality of memory cells and injecting electrons from the channel to the selected memory cell by F-N tunneling, and selecting a specific cell is accomplished by applying an appropriate bias voltage to each bit line, a plurality of word lines, the first and the second selective gate line, a common source line and a body biasing contact region of the NAND type flash memory array, respectively; and erasing the array by changing the bias voltage condition and injecting holes in the body region through F-N tunneling.

A detailed description of preferred embodiments of a method for operating a NAND type flash memory array of the present invention is provided with respect to the accompanying drawings. It must be comprehended that the following preferred embodiments are exemplary only to help understand the present invention and not to limit its interpretation.

Figure 1:
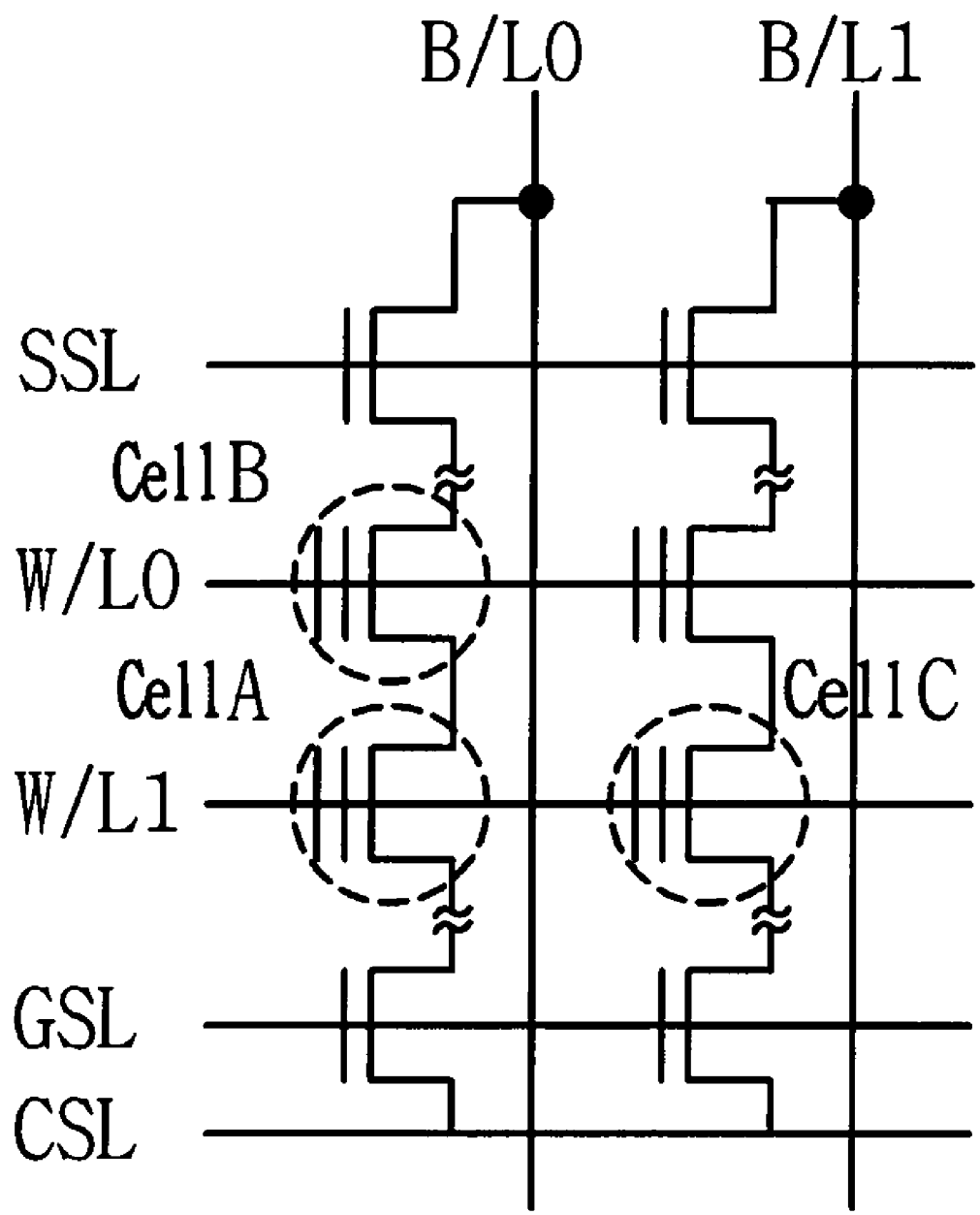
FIG. 1 is a circuit diagram of a NAND type flash memory array.

According to the invention as shown in FIG. 1, in a conventional NAND type flash memory array, the programming operation of the selected memory cell is comprised of applying a specific voltage $V_{SG1}$ to the first selective gate line; applying a lower voltage $V_{SEL}$ than the voltage $V_{SG1}$ to the bit line (B/L0), where the source/drain of the selected memory cell (cell A) is connected electrically to the other cells in series, in order to turn on the first selective transistor; applying the same or a higher voltage $V_{UNS}$ than the voltage $V_{SG1}$ to the other bit lines (B/L1 et al.) in order to turn off the first selective transistor; applying a higher voltage $V_{PGM}$ than the voltage $V_{SEL}$ to the word line (W/L1), to which the gate of the selected memory cell (cell A) is connected electrically, in order to generate F-N tunneling by channel electrons; applying a higher voltage $V_{PASS}$ than the voltage $V_{SEL}$ but lower than the voltage $V_{PGM}$ to the other word lines (W/L0 et al.) to turn on each channel of the other cells and not to generate F-N tunneling by channel electrons; applying the same voltage $V_{SG2}$ as the voltage $V_{SEL}$ to the second selective gate line (GSL) to turn off the second selective transistor; and applying the same voltage $V_S$ as the voltage $V_{SEL}$ to the common source line (CSL). The lower voltage $V_{PASS}$ than the voltage $V_{PGM}$ is sufficient to form a channel in the memory cell and it is preferable to apply the voltage $V_{PASS}$ to deplete the body region of the memory cell fully. And then, each memory cell is not influenced by the voltage $V_B$, which is applied to the body biasing contact region (BBC) on programming.

More specifically, the selected memory cell (cell A) can be programmed, in which the voltage $V_{SG1}$ and the voltage $V_{UNS}$ are $V_{CC}$, the voltage $V_{SEL}$, $V_{SG2}$ and $V_S$ are 0V (ground), the voltage $V_{PGM}$ is between 15V and 20V, and the $V_{PASS}$ is between 4V and 5V.

Also, the erasing operation of memory cells (cell A, cell B, cell C and so on) of the block can be executed simultaneously by floating the first selective gate line (SSL), the second selective gate line (GSL) and the common source line (CSL); applying specific voltage $V_{ERS}$ to all word lines (W/L0, W/L1 et al.) of the block including the specific memory cell (cell A); and applying higher voltage $V_B$ than $V_{ERS}$ to the body biasing contact region (BBC) in order to generate F-N tunneling by the holes in the body of memory cells (cell A, cell B, cell C and so on) connected with all word lines of the block. By floating the first selective gate line (SSL), each selective transistor, which is connected to the first selective gate line, is turned off, and each memory cell is not influenced by voltages applied to each bit line. However, it is preferable to float each bit line, also.

More specifically, memory cells (cell A, cell B, cell C and so on) of the block can be erased simultaneously, in which the voltage $V_{ERS}$ is 0V (ground) and the voltage $V_B$ is between 15V and 21V.

A supplementary description of preferred embodiments of a NAND type flash memory array and a method for operating the same of the present invention is as follows.

A NAND type flash memory works through read, program and erase operations. With an array structure of the present invention, the degree of transmission of the body bias to memory cells is dependent on the operating condition of the memory array. That is, on the read and program operation, by a depleted layer, the body bias hardly transmits to memory cells, and on the erase operation, by the depleted layer disappearing, the body bias transmits to memory cells wholly through a conduction path under the shallow junction. Therefore, it is possible to reduce the voltage $V_{PASS}$ very sharply from a conventional voltage 10V to about 4.5V, if an array structure of the present invention is operated as shown in TABLE 2.

TABLE 2

|  | Erase | Program | Read |
|---|---|---|---|
| PGM W/L | 0 | 15~20 | 0 |
| Pass W/L | 0 | 4.5 | 4.5 |
| SSL | F | Vcc | 4.5 |
| GSL | F | 0 | 4.5 |
| CSL | F | 0 | 0 |
| SEL B/L | F | 0 | 1.2 |
| UNS B/L | F | Vcc | <0.8 |
| BBC | 21 | 0 | 0 |

Figure 4:
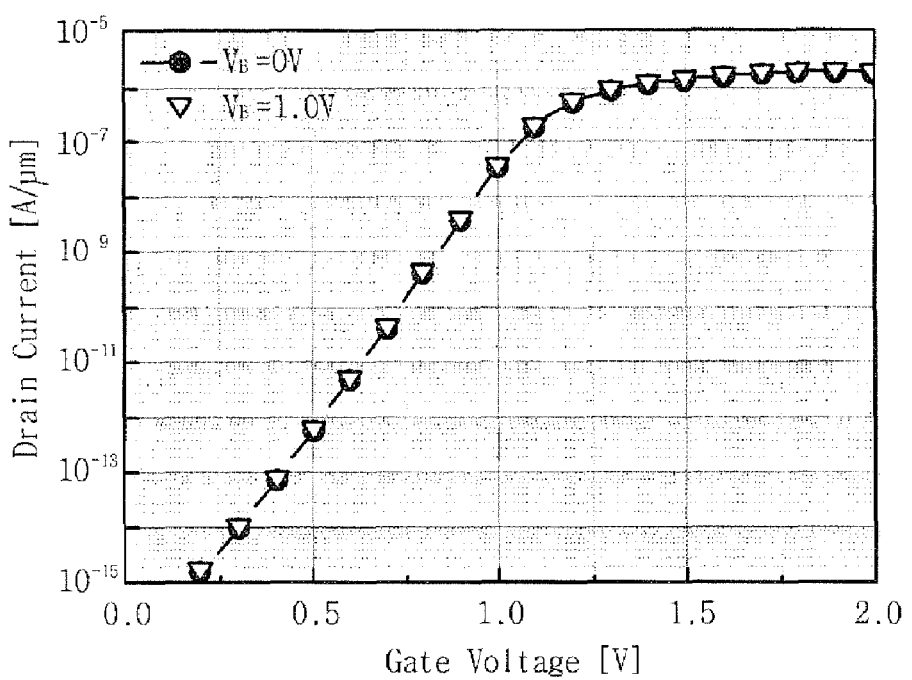
FIG. 4 is a graph illustrating the electrical characteristics on a reading operation in some embodiments of the invention.

Also, on the read operation, a body is fully depleted; the influence of the body bias on the channel potential is decreased markedly. FIG. 4 shows the result of simulation that on the read operation, a change in the characteristic of a transistor is not dependent on changes in the body bias. From this and the effect of the shallow junction, it can be validated that the characteristic of a memory cell transistor has been improved very sharply.

Figure 5:
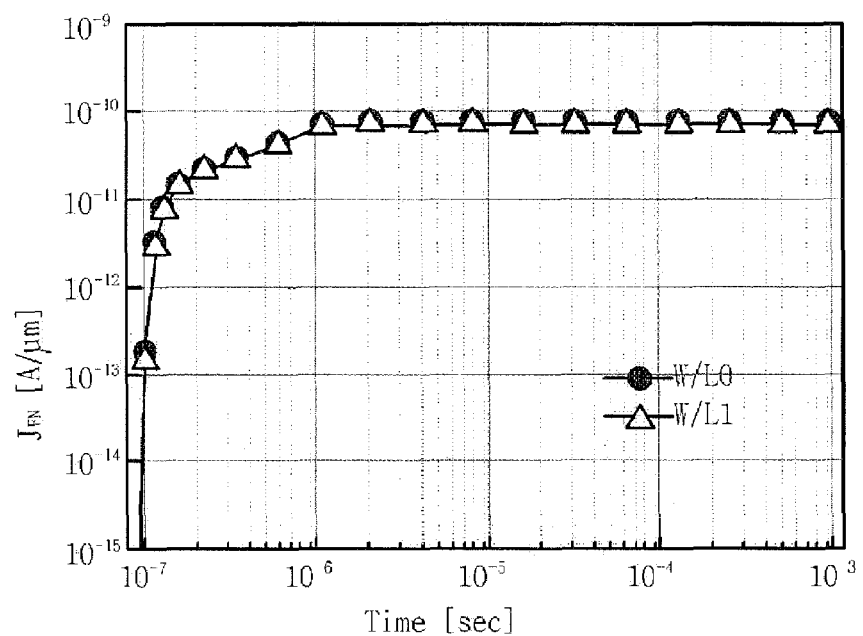
FIG. 5 is a graph illustrating the electrical characteristics on an erasing operation in some embodiments of the invention.

On the erase operation, because each transistor of memory cells is turned off, the body bias transmits to the channel region of each memory cell wholly, and in an SOI structure, the erase operation, which is the same as in a conventional bulk structure, can be performed. FIG. 5 shows the result of a simulation that on the erase operation, the body bias is transmitted to each memory cell, and a conventional erase current flows from a channel to a gate.

Figure 6:
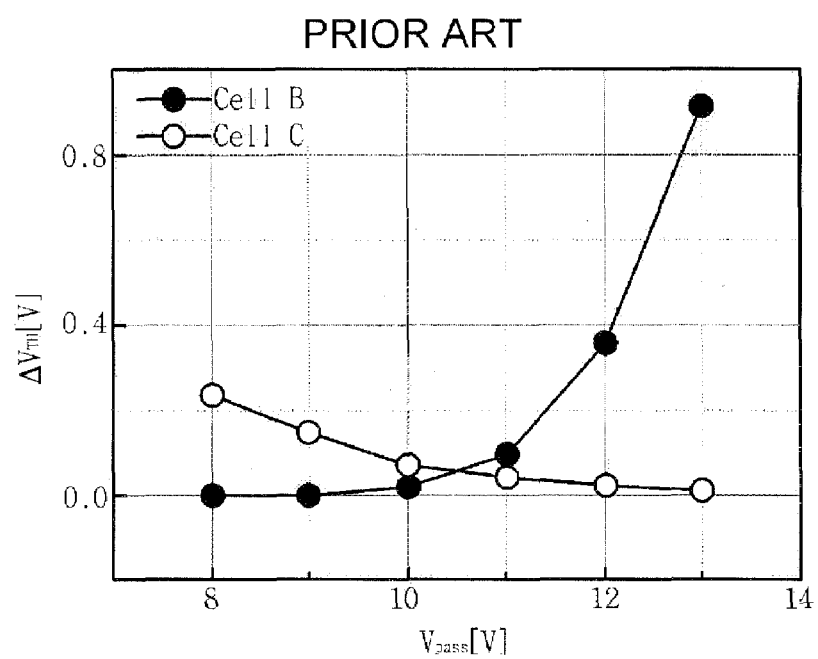
FIG. 6 is a graph illustrating the electrical characteristics which shows the degree of program disturbance on a programming operation in a conventional array.

On the other hand, on the program operation, a body region is fully depleted, and the body bias has little effect on the channel potential of a programming cell. Because there is little influence of the body bias, the channel potential of cell C as shown in FIG. 1 can be self-boosted with far lower voltage $V_{PASS}$ than in a conventional NAND type flash memory array. Therefore, it is possible that the voltage $V_{PASS}$ is far lower than in a conventional NAND type flash memory array. The result of simulation in FIGS. 6 and 7 shows how the degree of program disturbance varies as the voltage $V_{PASS}$ changes, on the program operation in a conventional array (FIG. 6) and an array of the present invention (FIG. 7). In a conventional NAND type flash memory array, the voltage $V_{PASS}$ about 10V can cause a change of about 0.1V and below in a threshold voltage in both cell B and cell C. However, with a structure of the present invention, the low voltage $V_{PASS}$ of 4.5V can result in a change about 0.002V and below, which is very small, in a threshold voltage. The low voltage $V_{PASS}$ makes it possible to design a simpler circuit, and decreasing the program disturbance of cell B and cell C improves the reliability of a NAND type flash memory array, and the problem of the limited numbers of programs can be greatly improved.

Consequently, with the present invention, in which a NAND type flash memory array is accomplished on an SOI substrate, the characteristic of a read operation can be improved. According to the invention, a conduction path, which is formed under the shallow junction of memory cells, is connected to a body biasing contact region, and one contact terminal, which is formed on the body biasing contact region, can do body biasing all memory cells, and it makes a memory cell perform the erase operation. On the program operation,

What is claimed is:

1. A NAND type flash memory array comprising:
one or more bit lines on an SOI substrate;
a first selective gate line arranged vertically to the bit lines;
a plurality of word lines arranged vertically to the bit lines;
a second selective gate line arranged vertically to the bit lines;
a common source line arranged vertically to the bit lines;
a plurality of memory cells connected in series with a first selective transistor and a second selective transistor along each bit line; and
one body biasing contact region,
wherein the body biasing contact region is located right next to the second selective gate line and connected to one side of an active region just below the second selective gate line when viewed in plan view, and
wherein N-type impurities are injected into a source/drain region (common source/drain region) of the memory cells, which are connected to each bit line in series, the depth of the junction is so shallow that a conduction path can be formed on a lower part of the common source/drain region and within the body biasing contact region.

2. The array of claim 1, wherein the silicon layer of the SOI substrate is shallow in order to make the body region of the memory cells depleted fully during a programming operation.

3. A method for operating a NAND type flash memory array, wherein the array comprises one or more bit lines on an SOI substrate, a first selective gate line arranged vertically to the bit lines, a plurality of word lines arranged vertically to the bit lines, a second selective gate line arranged vertically to the bit lines, a common source line arranged vertically to the bit lines, a plurality of memory cells connected in series with a first selective transistor and a second selective transistor along each bit line, and one body biasing contact region, wherein the body biasing contact region is located right next to the second selective gate line and connected to one side of an active region just below the second selective gate line when viewed in plan view, the method comprising:

programming the array by applying a predetermined bias voltage to each bit line, a plurality of word lines, the first selective gate line, the second selective gate line, the common source line and the body biasing contact region, respectively, to fully deplete the body region of the memory cells, select a specific cell from a plurality of memory cells and inject electrons in the channel to the selected memory cell by F-N tunneling; and erasing the array by changing the bias voltage condition to transmit the body bias to the memory cells through a conduction path under a source/drain region of the memory cells from the body biasing contact region and inject holes in the body region by F-N tunneling.

4. The method of claim 3, wherein the programming operation includes:
applying a specific voltage $V_{SG1}$ to the first selective gate line;
applying a lower voltage $V_{SEL}$ than the voltage $V_{SG1}$ to the bit line, where the source/drain of the selected memory cell is connected electrically to the other cells in series, in order to turn on the first selective transistor;
applying the same or a higher voltage $V_{UNS}$ than the voltage $V_{SG1}$ to the other bit lines in order to turn off the first selective transistor;
applying a higher voltage $V_{PGM}$ than the voltage $V_{SEL}$ to the word line, to which the gate of the selected memory cell is connected electrically, in order to generate F-N tunneling by channel electrons;
applying a higher voltage $V_{PASS}$ than the voltage $V_{SEL}$ but lower than the voltage $V_{PGM}$ to the other word lines to turn on each channel of the other cells and not to generate F-N tunneling by the channel electrons;
applying the same voltage $V_{SG2}$ as the voltage $V_{SEL}$ to the second selective gate line to turn off the second selective transistor; and
applying the same voltage Vs as the voltage $V_{SEL}$ to the common source line.

5. The method of claim 4, wherein, for programming operation, the voltage $V_{SG1}$ and the voltage $V_{UNS}$ are $V_{CC}$, the voltage $V_{SEL}$, $V_{SG2}$ and $V_S$ are 0V (ground), the voltage $V_{PGM}$ is between 15V and 20V, and the voltage $V_{PASS}$ is between 4V and 5V.

* * * * *